US012566198B2

(12) United States Patent
Quinlan et al.

(10) Patent No.: US 12,566,198 B2
(45) Date of Patent: Mar. 3, 2026

(54) PMU ALGORITHM

(71) Applicant: S&C Electric Company, Chicago, IL (US)

(72) Inventors: Michael Quinlan, Bolingbrook, IL (US); Yoav Sharon, Evanston, IL (US)

(73) Assignee: S&C Electric Company, Chicago, IL (US)

( * ) Notice: Subject to any disclaimer, the term of this patent is extended or adjusted under 35 U.S.C. 154(b) by 384 days.

(21) Appl. No.: 18/316,327

(22) Filed: May 12, 2023

(65) Prior Publication Data

US 2023/0400488 A1 Dec. 14, 2023

Related U.S. Application Data

(60) Provisional application No. 63/350,030, filed on Jun. 8, 2022.

(51) Int. Cl.
*G01R 25/00* (2006.01)
(52) U.S. Cl.
CPC .................................... *G01R 25/00* (2013.01)
(58) Field of Classification Search
CPC G01R 25/00; G01R 19/2513; G01R 19/2503; G01R 35/005
See application file for complete search history.

(56) References Cited

U.S. PATENT DOCUMENTS 6,141,196 A * 10/2000 Premerlani .......... H02H 1/0092
361/115
7,444,248 B2 * 10/2008 Premerlani ........ G01R 19/2513
702/64

10,884,038 B1 * 1/2021 Liu ..................... G01R 19/2513
10,901,014 B1 * 1/2021 Liu ....................... G01R 35/005
11,119,129 B1 * 9/2021 Liu ....................... G01R 25/005
2012/0310558 A1 * 12/2012 Taft ........................ G06Q 30/00
702/61
2018/0348266 A1 * 12/2018 Yao .................... G01R 19/2513

FOREIGN PATENT DOCUMENTS

WO WO-2015157989 A1 * 10/2015 ......... G01R 19/2513
WO WO-2018224866 A1 * 12/2018 ......... G01R 19/2513

OTHER PUBLICATIONS

Jun-Zhe Yang et al.; "A Precise Calculation of Power System Frequency and Phasor"; IEEE Transactions on Power Delivery vol. 15, No. Apr. 2000 p. 494-499 (6 pages).
Muhammad Usama Usman et al., "Applications of synchrophasor technologies in power stems"; J. Mod. Power Syst. Clean Energy (2019) 7 (2) p. 2011-226 (16 pages).

* cited by examiner

*Primary Examiner* — Stephanie E Bloss

(57) ABSTRACT

A system and method for generating phasors having a phase angle and magnitude from a sinusoidal power signal, and using the phasors to generate a frequency and RoCoF of the power signal. The system and method provide improvements over known systems and methods by correcting the frequency of sensor signals, providing a simplified phasor correction equation, reducing errors in a non-recursive DFT algorithm, improving frequency estimation by spacing out DFTs, correcting the sampling rate, providing linear interpolation of frequency and/or providing a variable DFT window length.

20 Claims, 2 Drawing Sheets

PMU ALGORITHM

CROSS-REFERENCE TO RELATED APPLICATION

This application claims the benefit of priority from the U.S. Provisional Application No. 63/350,030, filed on Jun. 8, 2022, the disclosure of which is hereby expressly incorporated herein by reference for all purposes.

BACKGROUND

Field

This disclosure relates generally to a system and method for generating phasors having a phase angle and magnitude from a sinusoidal power signal, and using the phasors to generate a frequency and rate of change of frequency (RoCoF) of the power signal, where the system and method provide for correcting the frequency of sensor signals, providing a simplified phasor correction equation, reducing errors in a non-recursive discrete Fourier transform (DFT) algorithm, improving frequency estimation by spacing out DFTs, correcting the sampling rate, providing linear interpolation of frequency and/or providing a variable DFT window length.

Discussion of the Related Art

A modern power system or grid is a complex interconnected electrical network that can generally be separated into generation, transmission, sub-transmission, distribution and loads. It is necessary to continuously monitor and protect the elements in a power system in real-time in order to avoid serious issues, such as component damage. Traditionally, supervisory control and data acquisition (SCADA) based monitoring is used for power systems. However, SCADA is unable to capture real-time dynamics of the system due to its low resolution, unsynchronized measurements of system parameters and incomplete information of the system behavior.

A phasor measurement unit (PMU) is a device that estimates the parameters magnitude, phase angle, frequency, and rate of change of frequency from the signals appearing at its input terminals or interface. Time synchronization is usually provided by GPS or the IEEE 1588 Precision Time Protocol, which allows synchronized real-time measurements of multiple remote points on the grid. PMUs are capable of capturing samples from a waveform in quick succession and reconstructing the phasor quantity, which is made up of an angle measurement and a magnitude measurement, where the resulting measurement is a synchrophasor.

Synchrophasors are estimated from samples of the voltage and current of AC waveforms and provided time synchronized phasor measurements used to monitor the health of a network across a wide area. The use of synchrophasors for transmission and sub-transmission applications have been mainly used for monitoring and post-processing data for fault and disturbance analysis. Applications in distribution circuits are still in their infancy, and utilities are still looking for problems that can be solved with this technology. Known switching devices and reclosers do not provide the required accuracy for PMU compliance, which requires utilities to install separate sensor devices and monitoring equipment to provide this accuracy. Some switching device relays (controls), as well as standalone PMU devices, are capable of supporting PMU data collection. However, their accuracy and compliance was only measured against their low-voltage (secondary) input, ignoring the sensors that translates the medium or high voltage of the grid (primary input) to low voltage. Thus, these devices are not capable of providing the needed accuracy to meet the IEEE standard requirements from a system level perspective By having switching devices that do not provide an accurate PMU reading, utilities are not able to use PMU data for more elaborate schemes used for protection as well as diagnostics and predictive maintenance.

Equations and formulas have been provided in the art to generate phasors having a phase angle and root mean square (RMS) magnitude from a sinusoidal power signal and using the phasors to generate a frequency and RoCoF of the power signal, where the frequency and RoCoF are defined as the first and second derivatives of phase angle. However, these known equations and formulas do not consider sensors and signal conditioning circuits, computational constraints in an embedded platform, potential numerical errors or other real world implementation issues. Thus, improvements can be made to more accurately generate the phasors and calculate the frequency and RoCoF of the power signal.

SUMMARY

The following discussion discloses and describes a system and method for generating phasors having a phase angle and magnitude from a sinusoidal power signal, and using the phasors to generate a frequency and RoCoF of the power signal. The system and method provide improvements over known systems and methods by correcting the frequency of sensor signals, providing a simplified phasor correction equation, reducing errors in a recursive DFT algorithm, improving frequency estimation by spacing out DFTs, correcting the sampling rate, providing linear interpolation of frequency and/or providing a variable DFT window length. In one embodiment, the method includes measuring the voltage and current of the power signal, converting the measured voltage and current to a series of digital samples, calculating a phasor having a phase angle and a magnitude by operating two recursive DFTs algorithms in parallel, where one DFT algorithm is reset while the other DFT algorithm produces data, calculating a frequency estimation of the phasor, correcting the phasor using the frequency estimation, filtering the frequency estimation, and calculating the RoCoF from the filtered frequency estimation.

Additional features of the present disclosure will become apparent from the following description and appended claims, taken in conjunction with the accompanying drawings.

DETAILED DESCRIPTION OF THE EMBODIMENTS

The following discussion of the embodiments of the disclosure directed to a system and method for generating phasors having a phase angle and RMS magnitude from a sinusoidal power signal and using the phasors to generate a frequency and RoCoF of the power signal is merely exemplary and is in no way intended to limit the disclosure or its applications or uses.

This disclosure proposes generating phasors having a phase angle and RMS magnitude from a sinusoidal power signal and using the phasors to generate a frequency and RoCoF of the power signal in, for example, a PMU. As will be discussed in detail below, the system and methods provide for correcting the frequency of sensor signals, providing a simplified phasor correction equation, reducing errors in a recursive DFT algorithm, improving frequency estimation by spacing out DFTs, correcting the sampling rate, providing linear interpolation of frequency and/or providing a variable DFT window length. The systems and methods discussed herein may have power transmission applications including wide area situational awareness and monitoring, such as wide area frequency monitoring, voltage stability monitoring and oscillation monitoring and detection, state estimation and fault location, identification and protective relaying. The systems and methods discussed herein may have power distribution applications including islanding detection, fault location, state estimation and harmonic estimation.

Various computers and controllers are described and implied herein. It is to be understood that the software applications and modules of these computers and controllers are executed on one or more computing devices having a processor and a memory module that stores data and executable code.

Figure 1:
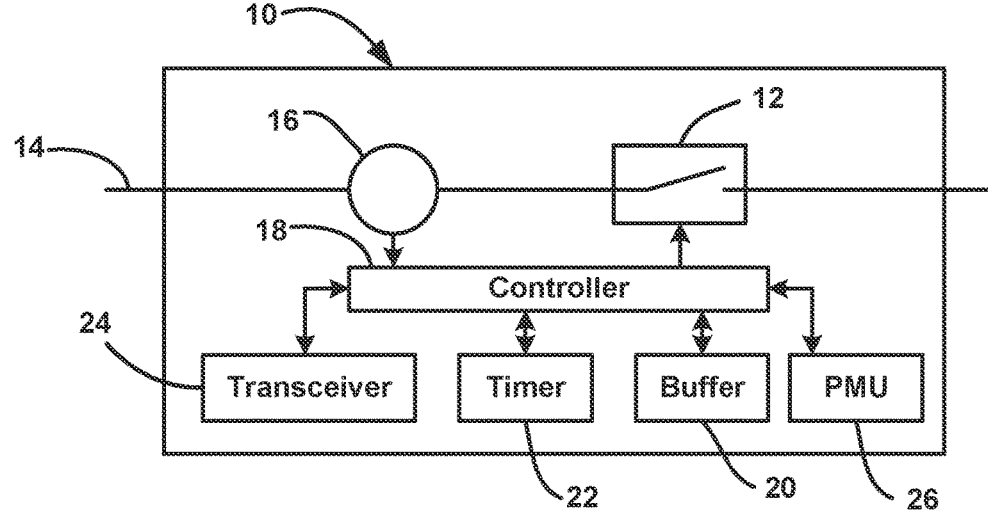
FIG. 1 is a schematic block diagram of a device including a PMU.

FIG. 1 is a simplified schematic block diagram of a device 10, such as a recloser, intended to be a non-limiting representation of any device used in a power network suitable for the purposes discussed herein. The device 10 includes a switch 12 that allows or prevents current flow on a power line 14, voltage/current sensors 16 that measure voltage and current on the line 14, a controller 18, a memory/buffer 20, a timer 22, a transceiver 24 for transmitting and receiving messages and a PMU 26.

Figure 2:
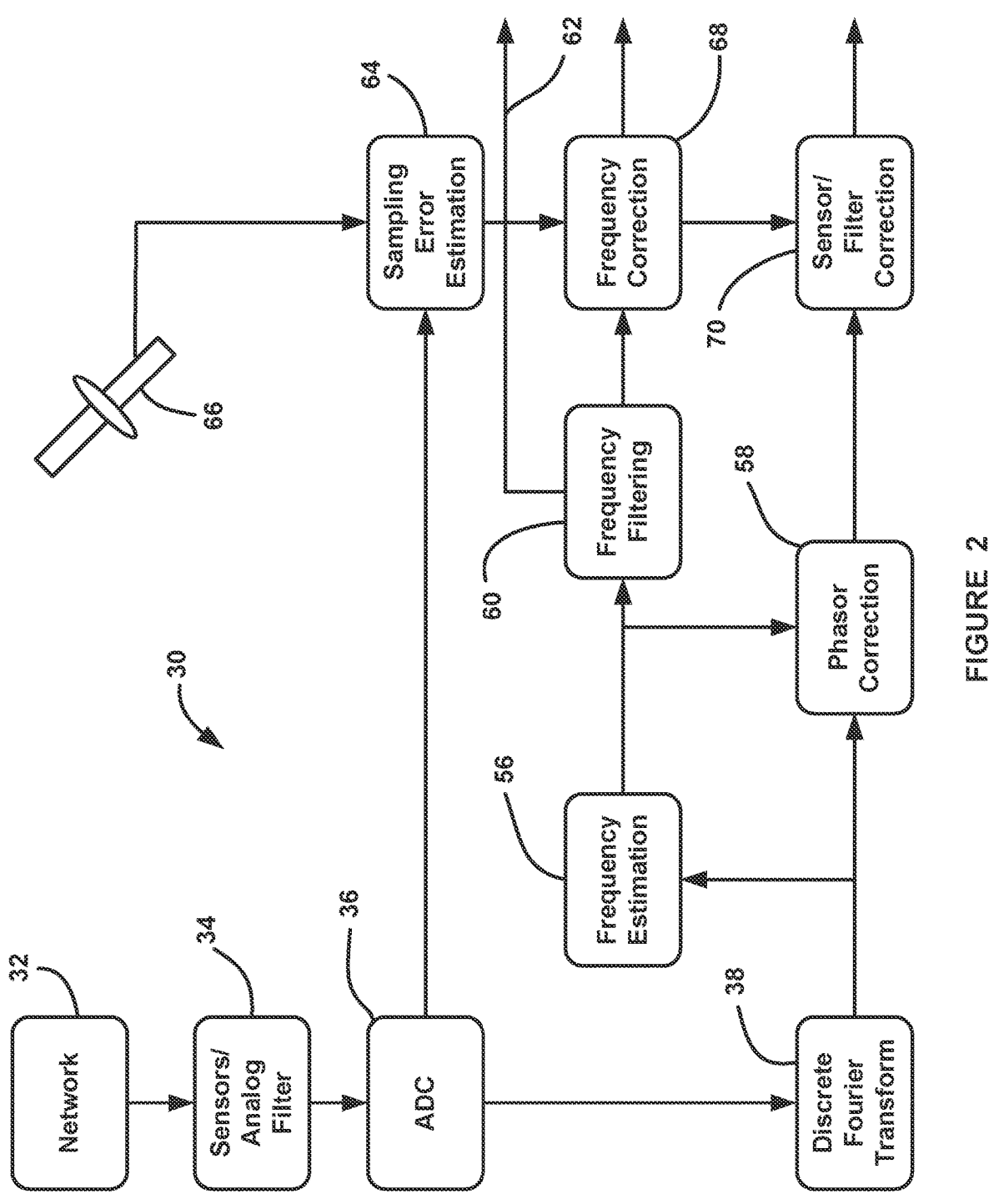
FIG. 2 is a schematic block diagram of a system that generates phasors having a phase angle and RMS magnitude from a sinusoidal power signal, and uses the phasors to generate a frequency and RoCoF of the power signal.

FIG. 2 is a schematic block diagram of a system 30 that may be part of the PMU 26 in the device 10. As will be discussed in detail below, the system 30 calculates phasors having a phase angle and RMS magnitude from a sinusoidal power signal, and uses the phasors to generate a frequency and a RoCoF of the power signal. The system 30 includes a block 32 representing a component in the power network, such as the power line 14, that provides a power signal to current and voltage sensors and an analog filter 34, which may be any suitable current and voltage sensors, such as voltage dividers and current transformers, where the filtering prevents anti-aliasing prior to signal sampling. The filtered current and voltage measurement signals are sent to an analog-to-digital converter (ADC) 36 that converts the filtered analog signal to digital samples at a certain sample rate set by a system oscillator determined by how many samples per cycle are desired that are stored.

A DFT processor 38 inputs the number of consecutive digital samples for a cycle length (50 Hz or 60 Hz) and Fourier transforms the digital samples to a phasor having a phase angle and an RMS magnitude. At the next sample time, the oldest digital sample is replaced with a new digital sample, and a new phasor having a new phase angle and magnitude is calculated. Known DFT algorithms for this purpose may be non-recursive where a complete set of digital samples is fed into the DFT processor 38 each time a new phasor is calculated. However, this is computationally burdensome as it processes a full cycle window every sample time. Known DFT algorithms for this purpose may also be recursive DFT algorithms where only the oldest digital sample is replaced with the newest digital sample in the full cycle window. However, recursive DFT algorithms are susceptible to carrying over errors, where the errors in the running sum will remain indefinitely.

This disclosure proposes overcoming the drawbacks of the non-recursive and recursive DFT algorithms referred to above by operating two recursive DFT algorithms in parallel in the DFT processor 38, which greatly reduces the computational burden. With two DFT algorithms, one DFT algorithm can be reset while the other DFT algorithm produces valid data. This provides similar error performance to that of a non-recursive DFT algorithm while being similarly computational as a single recursive DFT.

Figure 3:
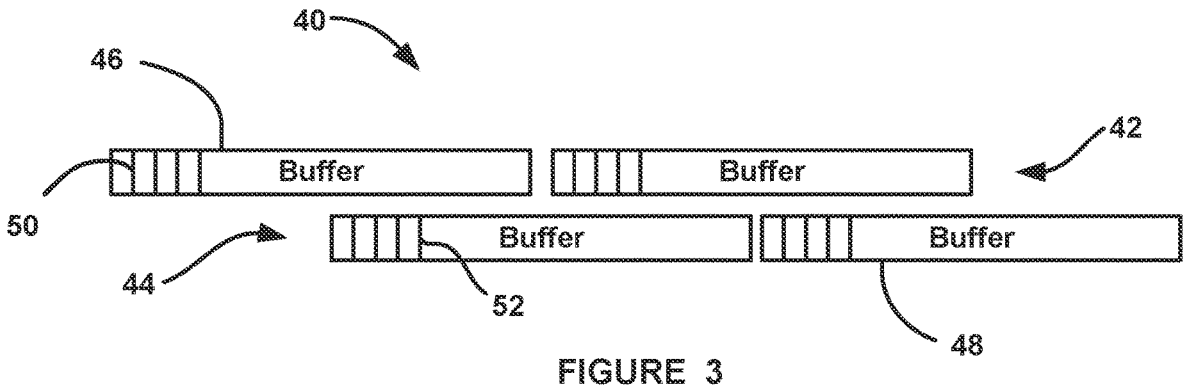
FIG. 3 is an illustration of two recursive DFTs operating in parallel.

FIG. 3 is an illustration of a DFT system 40 showing two DFT processors 42 and 44 operating in parallel in the manner described above. The DFT processor 42 includes buffers 46 and the DFT processor 44 includes buffers 48. Samples 50 are loaded into the first buffer 46 in the DFT processor 42 until the number of samples is enough to compute a Fourier transform, which is at the beginning of the first buffer 48 in the DFT processor 44. At this time, the Fourier transform is calculated in the DFT processor 42, samples 52 are loaded into the first buffer 48 of the DFT processor 44 and the DFT processor 42 is emptied of samples and reset. When enough samples are loaded into the first buffer 48 of the DFT processor 44 to calculate the Fourier transform, the beginning of the second buffer 46 of the DFT processor 42 begins loading samples, and the DFT processor 44 reports the Fourier transform and resets. Thus, if there is a corrupted sample it is quickly discarded.

The double recursive DFT algorithm can be implemented in software as follows, where one buffer sum A resets while another buffer sum B builds up the correct data.

```
dft_tbl = exp(-2j*pi/N*( 0 to M ))
signalBuffer = array of Length M (initialized to zeros)
useBufferA = true
bufferSumA = 0
bufferSumB = 0
C = (2/M) / sqrt(2)
ind = 1
Loop
    oldVal = signalBuffer(ind)
    signalBuffer(ind) = dft_tbl(ind) * new measurement
    newVal = signalBuffer(ind)
    if (useBufferA)
        bufferSumA += newVal – oldVal
        bufferSumB += newVal
        DFT = C / dft_tbl(ind+1) * bufferSumA
    else
        bufferSumA += newVal
        bufferSumB += newVal – oldVal
        DFT = C / dft_tbl(ind+1) * bufferSumB
    end
    ind++
    if (ind >= M)
        useBufferA = !useBufferA
        if useBufferA
            bufferSumB = 0
        else
            bufferSumA = 0
        end
        ind = 1
    end
endLoop
```

DFT algorithms having a sample window size of one cycle are useful for a fast response, but may accrue errors due to having a short sample window. The PMU standard allows for variable window sizes to achieve the desired performance. This disclosure also proposes reformulating the parallel DFT algorithms employed in the DTF processor 38 to have a variable size window that can be adjusted based on user settings to tradeoff response time and accuracy. In order to find the fundamental component of the signal, a DFT algorithm for the nominal frequency can be performed as shown by equation (1) below, where $x_{t_i+k}$ is the signal sample, M is the number of samples for the desired window, which needs to be a multiple of N.

$$\hat{D}_{t_i} = \left(\frac{2}{M}\right) \sum_{k=0}^{M-1} x_{t_i+k} \cdot e^{-jk \cdot \frac{2\pi}{N}} \qquad (1)$$

The length of the DFT sample window should be as long as possible in order to achieve the high accuracy required from the PMU standard in the steady state testing. The length of the sample window is limited by the step change testing in the standard, which dictates a maximum window length of two cycles for the P-Class and 7-84 cycles for the M-Class depending on the output rate.

The frequency of the phasor is estimated by a frequency estimation processor 56 that provides a frequency estimation of the phasor. Known equations employed for frequency estimation for this purpose require three consecutive phasor outputs from the DFT algorithms from the processor 38 to produce the frequency estimates of the phasors. Equation (2) below is one known equation that can be used to estimate the frequency from three consecutive DFT algorithm outputs.

$$f = \frac{60N}{2\pi} \cos^{-1}\left(\Re\left(\frac{\overline{X}_t + \overline{X}_{t+2} \pm \sqrt{(\overline{X}_t + \overline{X}_{t+2})^2 - 4 \cdot \overline{X}_{t+1}^2}}{2 \cdot \overline{X}_{t+1}}\right)\right) \qquad (2)$$

However, this method produces unacceptable errors in the presence of noise. This disclosure also proposes employing three phasor DFT algorithm outputs from the processor, but that are spaced some distance apart, i.e., not consecutive, such as ⅕ of a cycle, in the frequency estimation processor 56, which provides results that are much more accurate in the presence of noise. Specifically, equation (2) can be adjusted to use even-spaced, non-consecutive samples, as shown by equation (3) below, where δ≥1.

$$f = \frac{60N}{2\pi\delta} \cos^{-1}\left(\Re\left(\frac{\overline{X}_t + \overline{X}_{t+2\delta} \pm \sqrt{(\overline{X}_t + \overline{X}_{t+2\delta})^2 - 4 \cdot \overline{X}_{t+\delta}^2}}{2 \cdot \overline{X}_{t+\delta}}\right)\right) \qquad (3)$$

The frequency estimation from the frequency estimation processor 56 and the phasor from the DFT processor 38 are sent to a phasor correction processor 58 that corrects the phase angle and RMS magnitude of the phasors using the frequency estimate. Equation (4) below is known to be used to correct a phasor based on estimated frequency, where N is the number of samples per nominal cycle and Δf is the frequency deviation from the nominal frequency.

$$X = \text{abs}(A_r) \cdot \frac{N \cdot \sin\left(\frac{\pi \cdot \Delta f}{F_N \cdot N}\right)}{\sin\left(\frac{\pi \cdot \Delta f}{F_N}\right)} \qquad (4)$$

However, equation (4) produces an error for a nominal frequency result. Particularly, when Δf approaches 0 (nominal frequency), equation (4) can produce a large numerical error. Additionally, equation (4) is computationally burdensome.

This disclosure proposes using a Taylor expansion around the nominal frequency in the phasor correction processor 58 so that equation (4) can be simplified without losing significant accuracy and will not have a divide by zero error for the nominal frequency. Particularly, since Δf is rarely more than 1 Hz from zero, a Taylor expansion can be used to remove this error, as shown by equation (5) below. An additional benefit of equation (5) is decreased computational burden.

$$X = \text{abs}(A_r) \cdot \left(1 + \Delta f^2 \cdot \left(\frac{(N^2 - 1) \cdot \pi^2}{6 \cdot F_N^2 \cdot N^2}\right)\right) \qquad (5)$$

Another option is that if Δf is sufficiently close to zero, no correction needs to be applied, as the original DFT result will be accurate.

The frequency estimation is filtered by a frequency filter 60. The known frequency filters for this purpose perform averaging on frequency estimates that achieve high accuracy results, but the results represent the frequency at the center of the sample window. Since the filter length of a phasor and frequency are not equal, the timestamp will not be at the center of the frequency window. The length of the filter is determined by the need to reject noise. In addition, the standard requires information to be sent within a short time of when the applicable data is recorded. If the system waits until all the data necessary for the filter is recorded, and then report the frequency estimated at the center of the sample window, this will violate the requirement to send the information within the specified time. Note that during frequency ramp tests in particular, the frequency at the center of the sample window and at the edges of the sample window can be sufficiently different to result in non-compliance if not corrected.

This disclosure proposes performing linear interpolation on the frequency window in the frequency filter 60 that allows for the frequency to be reported at any point in the frequency window while allowing for better noise rejection and higher accuracy. By performing a recursive linear least squares function, this can be achieved with a low computational burden. The recursive form of this linear interpolation is shown by equations (6) and (7) below, where constants $r_1$ and $r_2$ and the variable G are defined. Equations (8)-(11) run at every time interval, where L is the desired size of the frequency window. Equation (11) calculates the RoCoF, which is output on line 62. After obtaining the average frequency $f_{ave}$ and RoCoF, the frequency can be adjusted as shown by equation (12). The filtering process can employ two filters operating in parallel in the same manner as discussed above for the two recursive DFT algorithms running in parallel in the DFT processor 38, which greatly reduces the computational burden. With two filter processors, one filter can be reset while the other filter produces valid data.

$$r_1 = \frac{L}{L \cdot \sum_{i=1}^{L} t_i^2 - \left(\sum_{i=1}^{L} t_i\right)^2} \qquad (6)$$

-continued $$r_2 = \frac{\sum_{i=1}^{L} t_i}{L \cdot \sum_{i=1}^{L} t_i^2 - \left(\sum_{i=1}^{L} t_i\right)^2} \quad G = 0 \tag{7}$$

$$f_{sum} + = f_t - f_{t-L} \tag{8}$$

$$f_{ave} = \frac{f_{sum}}{L} \tag{9}$$

$$G += \frac{(f_t \cdot L - f_{sum})}{N \cdot F_n} \tag{10}$$

$$RoCoF = r_1 \cdot G - r_2 \cdot f_{sum} \tag{11}$$

$$f_{adj} = f_{ave} + T_{adj} \cdot RoCoF \tag{12}$$

Known PMU algorithms consider off-frequency input signals, i.e., voltage and current. However, off-frequency analog-to-digital sampling must also be taken into account, as it also affects performance. This disclosure further proposes that by accurately knowing the difference in GPS time and the sampling rate, the deviation in frequency measurements can be mathematically corrected without having to adjust the analog-to-digital sampling rate. This saves computation effort and complexity in the sampling system. Any error in the sample rate will be reflected in the frequency measurement. The actual sampling rate can be computed, for example, as the difference in the GPS time stamp of two samples that are some time apart from each other.

To accomplish this, the system 30 also includes a sampling error estimation processor 64 that receives a GPS timing signal from a satellite 66 and a sample time for each sample from the ADC 36. The filtered frequency from the filter 60 and the error between the sample time and the GPS time is also sent to a frequency correction processor 68, which generates a frequency output. Using the actual sample rate, compared to an accurate time reference, equation (13) below can perform the correction to the frequency measurement, where $R_{sample}$ is the actual sampling rate and $R_{ref}$ is the nominal rate.

$$F_{act} = f \cdot \left(\frac{R_{sample}}{R_{ref}}\right) \tag{13}$$

For the phasor correction in equation (5), the frequency f should be used for accurate results.

The corrected frequency and the corrected phasor are sent to a sensor and filter correction processor 70 that generates the phasor output. In the known phasor calculating systems, for voltage and current sensors, the signal conditioning circuit response is dependent on the frequency of the measured signal. Calibration factors are typically measured at nominal frequency and are applied as a constant. This disclosure also proposes employing a frequency dependent model of the sensors to adjust the sensor calibration correction factor employed in the sensor and filter correction processor 70 to produce the correct results. Typical primary voltage and current sensors and conditioning filters have a frequency dependency. Given a sensor transfer function of H of these components, the frequency response can be modeled. This function can be calculated and compared to the results of the nominal response of the filter 60. The differences can then be applied to the phasor outputs as shown by equation (14) below, where $F_n$ is the nominal frequency and f is the estimated frequency. The updated frequency $F_{act}$ from equation (13) can be used in equation (14) to correct for the sensors.

$$X_{corrected} = X_{measured} \cdot \frac{H(F_n)}{H(f)} \tag{14}$$

Modeling of the full transfer function of the sensors may be computationally complex. As a simplification, a linear model can typically be developed without losing much accuracy.

The foregoing discussion discloses and describes merely exemplary embodiments of the present disclosure. One skilled in the art will readily recognize from such discussion and from the accompanying drawings and claims that various changes, modifications and variations can be made therein without departing from the spirit and scope of the disclosure as defined in the following claims.

What is claimed is:

1. A system for controlling electric power through a switch in a power network, the system comprising: a switch configured to allow or interrupt current flow on a power line; voltage and current sensors configured to measure voltage and current on the power line; an analog-to-digital converter configured to convert the measured voltage and current to digital samples; a phasor measurement unit (PMU) comprising: a processor configured to: calculate phasors having a phase angle and magnitude from the digital samples using at least one discrete Fourier transform (DFT) algorithm; estimate a frequency of the phasors using a plurality of spaced-apart, non-consecutive phasors; calculate a rate of change of frequency (RoCoF) from the estimated frequency; and generate a control signal for the switch based on the estimated frequency and RoCoF.

2. The system of claim 1, wherein the plurality of spaced-apart phasors comprises three phasors spaced apart by at least one-fifth of a cycle.

3. The system of claim 1, wherein the processor is further configured to operate two recursive DFT algorithms in parallel, wherein one DFT algorithm is reset while the other produces valid data.

4. The system of claim 1, wherein the processor is further configured to correct the phasors using the estimated frequency.

5. The system of claim 4, wherein correcting the phasors includes applying a Taylor expansion around a nominal frequency to reduce computational burden and avoid numerical errors.

6. The system of claim 1, wherein the processor is further configured to filter the estimated frequency using two filters operating in parallel.

7. The system of claim 6, wherein filtering includes performing linear interpolation on a sample window to allow frequency estimation to be reported at any point in the window.

8. The system of claim 7, wherein the linear interpolation is performed using a recursive linear least squares function.

9. The system of claim 1, wherein the processor is further configured to calculate a sampling error between a GPS timing signal and a sample rate, and correct the estimated frequency based on the sampling error.

10. The system of claim 1, wherein the control signal generated by the processor is configured to open or close the switch in response to a threshold condition based on the estimated frequency or RoCoF.

11. A method for controlling electric power through a switch in a power network, the method comprising: measuring voltage and current on a power line using voltage and current sensors; converting the measured voltage and current to digital samples using an analog-to-digital converter; calculating phasors having a phase angle and magnitude from the digital samples using at least one discrete Fourier transform (DFT) algorithm; estimating a frequency of the phasors using a plurality of spaced-apart, non-consecutive phasors; calculating a rate of change of frequency (RoCoF) from the estimated frequency; and generating a control signal for the switch based on the estimated frequency and RoCoF.

12. The method of claim 11, wherein the plurality of spaced-apart phasors comprises three phasors spaced apart by at least one-fifth of a cycle.

13. The method of claim 11, further comprising operating two recursive DFT algorithms in parallel, wherein one DFT algorithm is reset while the other produces valid data.

14. The method of claim 11, further comprising correcting the phasors using the estimated frequency.

15. The method of claim 14, wherein correcting the phasors includes applying a Taylor expansion around a nominal frequency.

16. The method of claim 11, further comprising filtering the estimated frequency using two filters operating in parallel.

17. The method of claim 16, wherein filtering includes performing linear interpolation on a sample window to allow frequency estimation to be reported at any point in the window.

18. The method of claim 17, wherein the linear interpolation is performed using a recursive linear least squares function.

19. The method of claim 11, further comprising calculating a sampling error between a GPS timing signal and a sample rate, and correcting the estimated frequency based on the sampling error.

20. The method of claim 11, wherein the control signal is configured to open or close the switch in response to a threshold condition based on the estimated frequency or RoCoF.

* * * * *